(12) United States Patent
Nihei et al.

(10) Patent No.: US 7,499,478 B2
(45) Date of Patent: *Mar. 3, 2009

(54) LASER DRIVER, OPTICAL DISK APPARATUS USING THE SAME, AND LASER CONTROL METHOD

(75) Inventors: Makoto Nihei, Hitachinaka (JP); Toshimitsu Kaku, Sagamihara (JP); Akihiro Asada, Chigasaki (JP); Takashi Hoshino, Yokohama (JP)

(73) Assignees: Hitachi, Ltd., Tokyo (JP); Hitachi-LG Data Storage, Inc., Tokyo (JP)

( * ) Notice: Subject to any disclaimer, the term of this patent is extended or adjusted under 35 U.S.C. 154(b) by 372 days.

This patent is subject to a terminal disclaimer.

(21) Appl. No.: 10/937,908

(22) Filed: Sep. 9, 2004

(65) Prior Publication Data

US 2005/0030989 A1   Feb. 10, 2005

Related U.S. Application Data

(63) Continuation of application No. 09/943,860, filed on Aug. 30, 2001, now Pat. No. 6,810,050.

(30) Foreign Application Priority Data

May 28, 2001  (JP)  ............... 2001-158105

(51) Int. Cl.
   *H01S 3/13* (2006.01)
(52) U.S. Cl. ............... 372/29.015; 372/33; 372/38.1; 372/38.01; 372/38.02; 372/38.07
(58) Field of Classification Search ............ 372/29.015, 372/33, 38.1, 38.01, 38.02, 38.07
See application file for complete search history.

(56) References Cited

U.S. PATENT DOCUMENTS

| | | | | | |
|---|---|---|---|---|---|
| 4,329,664 | A | * | 5/1982 | Javan | 359/276 |
| 4,819,242 | A | * | 4/1989 | Kaku et al. | 372/38.02 |
| 5,018,155 | A | * | 5/1991 | Miyairi | 372/31 |
| 5,127,015 | A | * | 6/1992 | Chikugawa et al. | 372/29.01 |
| 5,579,328 | A | * | 11/1996 | Habel et al. | 372/31 |
| 6,489,600 | B1 | * | 12/2002 | Taguchi | 250/205 |
| 6,810,050 | B2 | * | 10/2004 | Nihei et al. | 372/38.02 |
| 2003/0007526 | A1 | * | 1/2003 | Pontis et al. | 372/38.02 |

FOREIGN PATENT DOCUMENTS

| | | |
|---|---|---|
| JP | 03-025732 A | 2/1991 |
| JP | 07-073497 A | 3/1995 |
| JP | 11-054826 A | 2/1999 |
| JP | 2002-230814 A | 8/2002 |

\* cited by examiner

*Primary Examiner*—Kenneth A Parker
*Assistant Examiner*—Hrayr A. Sayadian
(74) *Attorney, Agent, or Firm*—Townsend and Townsend and Crew LLP

(57) ABSTRACT

An optical disk apparatus uses a laser driver which can measure the frequency of the high-frequency superimposed current of the semiconductor laser simply and accurately. The apparatus includes a semiconductor laser which emits a laser beam onto the optical disk, a laser driver which drives the semiconductor laser with a current, with the high-frequency current being superimposed thereon, and measures the frequency of the high-frequency current, and a main controller which controls the frequency of the high-frequency current produced by the laser driver by using the frequency measured by the laser driver.

3 Claims, 6 Drawing Sheets

LASER DRIVER, OPTICAL DISK APPARATUS USING THE SAME, AND LASER CONTROL METHOD

This application is a continuation of U.S. patent application Ser. No. 09/943,860, filed on Aug. 30, 2001, now U.S. Pat. No. 6,810,050, which claims priority to Japanese Patent Application No. 2001-158105, filed on May 28, 2001, both of which are incorporated by reference herein for all purposes.

BACKGROUND OF THE INVENTION

The present invention relates to an optical disk apparatus which records and reproduces information on an optical disk, and particularly to a laser driver which is useful for improving the quality of reproduced signal and to an optical disk apparatus which uses the laser driver.

Optical disk information reproduction apparatus based on the semiconductor laser adopts the high frequency superimposition scheme in which a high-frequency current is superimposed on a d.c. current for driving the semiconductor laser in order to reduce the laser noise which emerges due to the interference between the semiconductor laser and the reflected light from the recording medium. However, despite the use of the high frequency superimposition scheme, there was found a phenomenon of the presence of a significant residual laser noise. A study conducted recently revealed that this phenomenon is caused by the relaxation oscillation which arises when the semiconductor laser undergoes the high-frequency modulation such as the case of high frequency superimposition scheme, and that the resulting laser noise is dependent on the superimposed frequency. A method of setting the superimposed frequency in consideration of the laser noise caused by the relaxation oscillation is disclosed in Japanese Patent Unexamined Publication No. Hei 11-54826.

FIG. 7 shows a measurement result of the relation between the laser noise and the frequency and amplitude of the superimposed high-frequency current. The laser noise was managed to be within the allowable level by setting the superimposed current within region A or B on the graph of FIG. 7. However, the high frequency superimposing circuit has its operational efficiency falling as the frequency rises, resulting in an increased heat dissipation. The semiconductor laser operating at a higher temperature produces a larger laser noise in general, and therefore the region B located in the higher frequency range is not suitable for use. Another region C shown by hatching in FIG. 7 necessitates the reduction of unwanted radiation or electromagnetic interference (EMI) by means of an expensive shielding structure to meet the regulation, and therefore this region is avoided. On this account, for the fulfillment of both the reduction of laser noise and the reduction of EMI, the superimposed current needs to be set within the region A and at the same time outside the region C, i.e., the superimposed current must be within range D in terms of frequency and within range E in terms of amplitude.

FIG. 4 shows by block diagram a laser driver which controls the superimposed current. The laser driver is made up of a semiconductor laser drive circuit 1, an oscillator control circuit 3 and oscillator 4 which form a high frequency superimposing oscillator, and an adder 6. At information reproduction, the semiconductor laser drive circuit 1 releases a laser driving d.c. current 2 and the adder 6 superimposes the output (high-frequency current 5) of the oscillator 4 to the laser driving d.c. current 2, so that a resulting current drives a laser diode 8. The oscillator 4 has its output frequency and amplitude controlled by the oscillator control circuit 3, which is responsive to an oscillator control signal 31 provided by an external microcomputer. Based on this function, the prior art method sets the frequency and amplitude of the superimposed current to meet the above-mentioned conditions.

BRIEF SUMMARY OF THE INVENTION

However, this laser driver involves a problem of the disparity among individual devices, and some laser drivers having an invariable or same frequency setting are found to vary their output frequencies out of the intended frequency range D due to the disparity in frequency of the high-frequency current 5 produced by the oscillator 4. The frequency disparity of the high-frequency current 5, which is attributable to the semiconductor manufacturing process, is difficult to make smaller, giving rise to the need of frequency adjustment for the superimposed current before the shipment from the factory. This frequency adjusting process is based on the detection of a weak EMI of the laser driver with an antenna and the measurement of frequency with a spectrum analyzer, and it has been demanded the simplification of this intricate measuring facility.

Accordingly, it is an object of the present invention to provide a laser driver which is capable of measuring the superimposed frequency of semiconductor laser simply and accurately, and provide an optical disk apparatus which uses the laser driver.

Another object of the present invention is to provide an optical disk apparatus which is capable, within the apparatus, of controlling the superimposed frequency of semiconductor laser.

Specifically, the inventive optical disk apparatus comprises a semiconductor laser which projects a laser beam onto an optical disk, a semiconductor laser driver which drives the semiconductor laser with a current, with a high-frequency current being superimposed thereon, and measures the frequency of the superimposed current, and a main controller which controls the frequency of the superimposed current output by the semiconductor laser driver by using the frequency measured by the semiconductor laser driver.

The apparatus further includes a demodulation device which implements the error correction for reproduced data and the detection of error rate, and a data strobe device which detects the jitter emerging at the analog-to-digital conversion of the reproduced signal. The main controller uses the frequency measured by a frequency measuring circuit and the detected error rate or jitter to determine the frequency which minimizes the error rate or jitter, and controls the laser driver to produce a superimposed current of the determined frequency.

The inventive laser driver comprises a semiconductor laser drive circuit which outputs a d.c. current to a semiconductor laser, a high frequency superimposing oscillator which superimposes a high-frequency current on the output of the semiconductor laser drive circuit, and a frequency measuring circuit which measures the frequency of the superimposed current produced by the high frequency superimposing oscillator. The frequency measuring circuit is specifically made up of a digitizing circuit which converts the high-frequency current signal into a binary digital signal and a frequency demultiplying circuit which demultiplies the frequency of digital signal to produce a high frequency superimposition monitor signal. The frequency measuring circuit may further include a frequency counter which measures the frequency of the superimposed current based on a reference clock signal provided externally and the superimposition monitor signal.

The inventive laser control method, which is intended for an optical disk apparatus which drives a semiconductor laser with a high-frequency current to project a laser beam onto an optical disk thereby to reproduce data recorded on the optical disk, is designed to measure the frequency of the high-frequency current and control the frequency by using the measured frequency. Specifically, it detects the above-mentioned error rate or jitter and controls the semiconductor laser by using the detection result and measured frequency so that the error rate or jitter may be minimal.

DETAILED DESCRIPTION OF THE INVENTION

The embodiments of the present invention will be explained with reference to the drawings.

Figure 1:
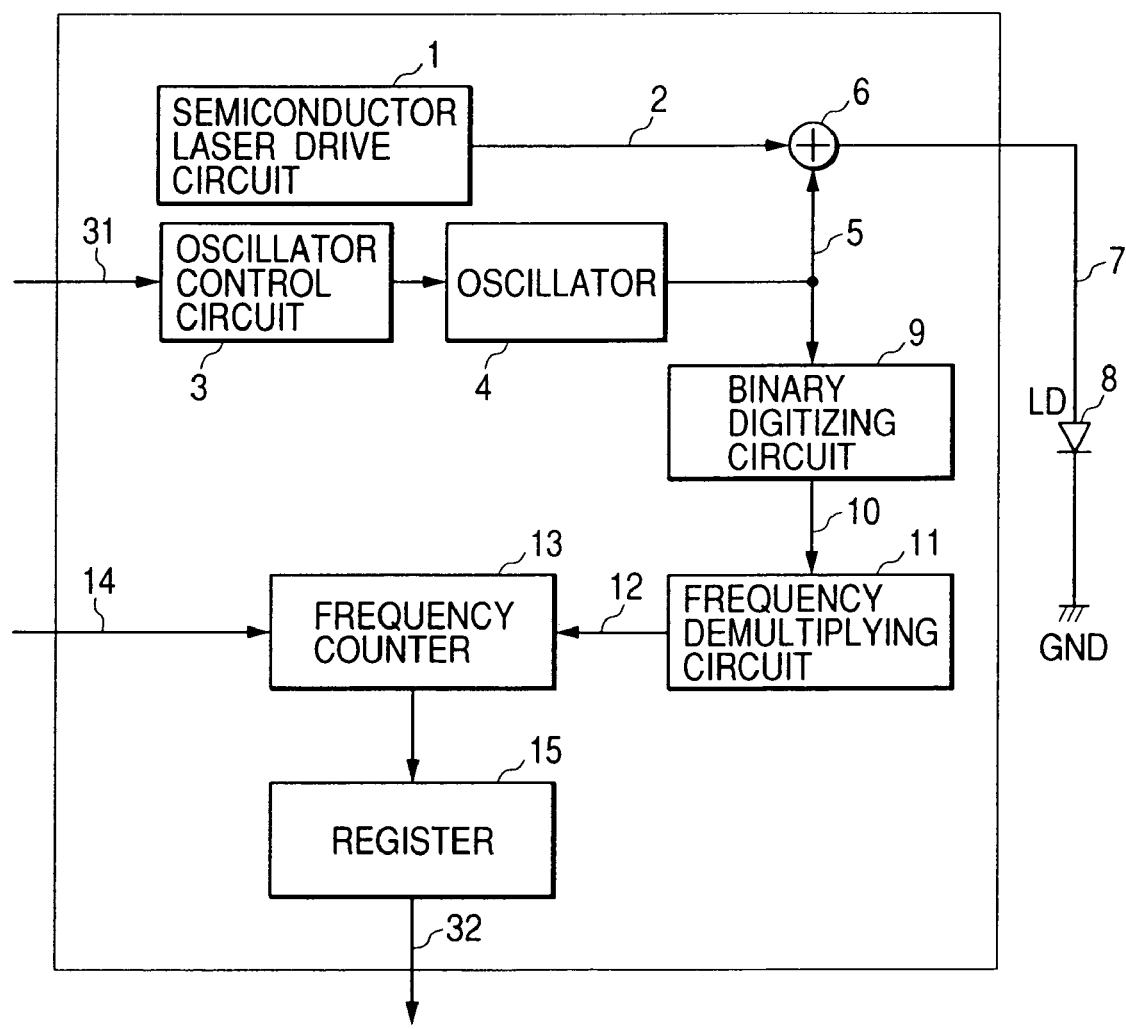
FIG. 1 is a block diagram of the laser driver based on a first embodiment of this invention.
Figure 4:
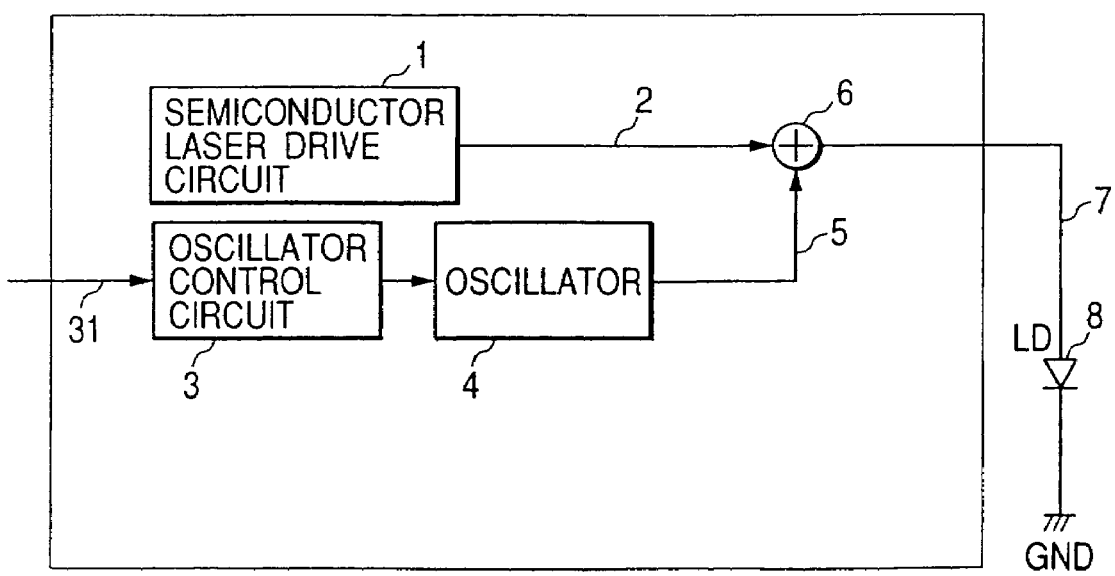
FIG. 4 is a block diagram of the conventional laser driver.

FIG. 1 shows by block diagram the circuit arrangement of the laser driver based on the first embodiment of this invention. Functional blocks of FIG. 1 identical to those of the conventional laser driver shown in FIG. 4 are referred to by the common symbols. The laser driver of this embodiment includes a frequency measuring circuit which measures the frequency of a high-frequency current produced by an oscillator 4 in a high frequency superimposing oscillator, and in this example it is made up of a binary digitizing circuit 9, a frequency demultiplying circuit 11, and a frequency counter 13. The laser driver further includes a register 15 which holds the value of frequency of the superimposed current measured by the frequency measuring circuit.

The oscillator 4 is a variable-frequency oscillator having its output frequency controlled continuously in response to an input analog voltage. The oscillator 4 outputs a high-frequency current 5 having its frequency and amplitude controlled by an oscillator control circuit 3. The oscillator control circuit 3 generates an analog voltage in response to an oscillator control signal 31 provided by an external microcomputer, and outputs the voltage into the oscillator 4. The high-frequency current 5 is fed to an adder 6 which produces a semiconductor laser drive current 7 and to the binary digitizing circuit 9 which produces a high-frequency digital signal 10 used for the measurement of superimposed frequency. The adder 6 superimposes the input high-frequency current 5 on a semiconductor laser driving d.c. current 2 produced by a semiconductor laser drive circuit 1, and a resulting semiconductor laser drive current 7 drives a semiconductor laser 8.

Figure 2:
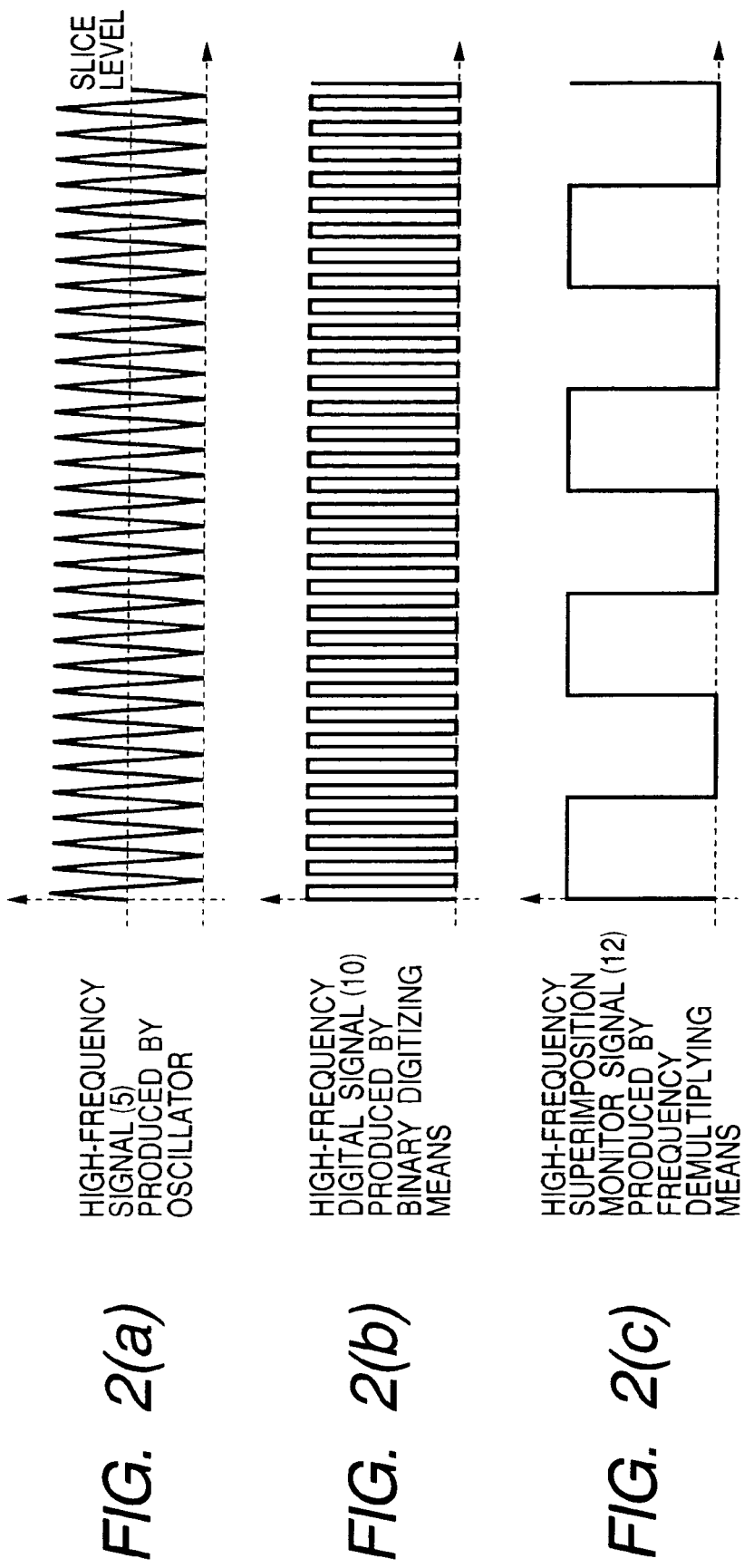
FIG. 2 is a waveform diagram showing the signals in the laser driver of the first embodiment.

The high-frequency current 5 is an analog signal as shown by FIG. 2(a), and for the digital circuit processing, it is digitized by the binary digitizing circuit 9 to become the high-frequency digital signal 10 as shown by FIG. 2(b). The high-frequency digital signal 10, which can cause the noise due to its extremely high frequency, is rendered the frequency demultiplication by the frequency demultiplying circuit 11 to become a high frequency superimposition monitor signal 12 having a relatively low frequency as shown by FIG. 2(c). The superimposition monitor signal 12 is input into the frequency counter 13, which operates based on an external reference clock signal 14 to measure the frequency of the superimposition monitor signal 12. The frequency counter 13 counts up pulses from the frequency demultiplying circuit 11 during one period of the reference clock signal 14.

The pulse count value is held by the register 15, and it is released by request to the controlling microcomputer. The frequency demultiplying circuit 11 has its demultiplication factor determined in advance, and it is possible to evaluate the frequency of the actual superimposed current by multiplying the measurement result with the demultiply factor.

Figure 3:
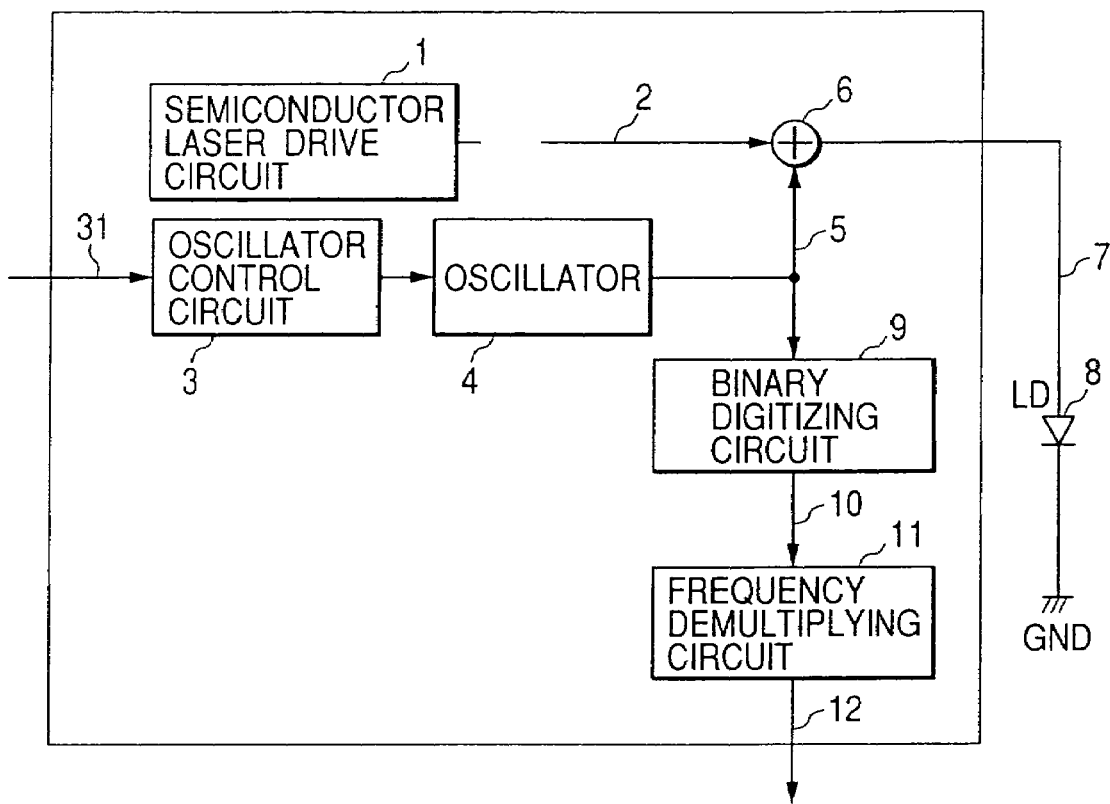
FIG. 3 is a block diagram of the laser driver based on a second embodiment of this invention.

Next, the laser driver based on the second embodiment of this invention will be explained with reference to FIG. 3. As mentioned previously, it is possible by using the laser driver of FIG. 1 to measure the frequency with in the optical disk apparatus. Whereas, in case the laser driver is designed to undergo the frequency adjustment before the shipment from the factory, the laser driver shown in FIG. 1 has its frequency counter 13 and register 15 eliminated and has additional provision of an output terminal for the superimposition monitor signal 12 on the optical disk apparatus to become as shown in FIG. 3. The superimposition monitor signal 12 is input into an external measuring instrument to adjust the frequency of the superimposed current. Although this scheme necessitates the initial adjustment in the factory, it is to measure the superimposition monitor signal, instead of measuring a weak unwanted radiation or EMI, allowing the simpler provision of an antenna and spectrum analyzer.

Next, the third embodiment of this invention will be explained with reference to FIG. 5, which shows by block diagram the optical disk reproduction apparatus of this embodiment.

Figure 5:
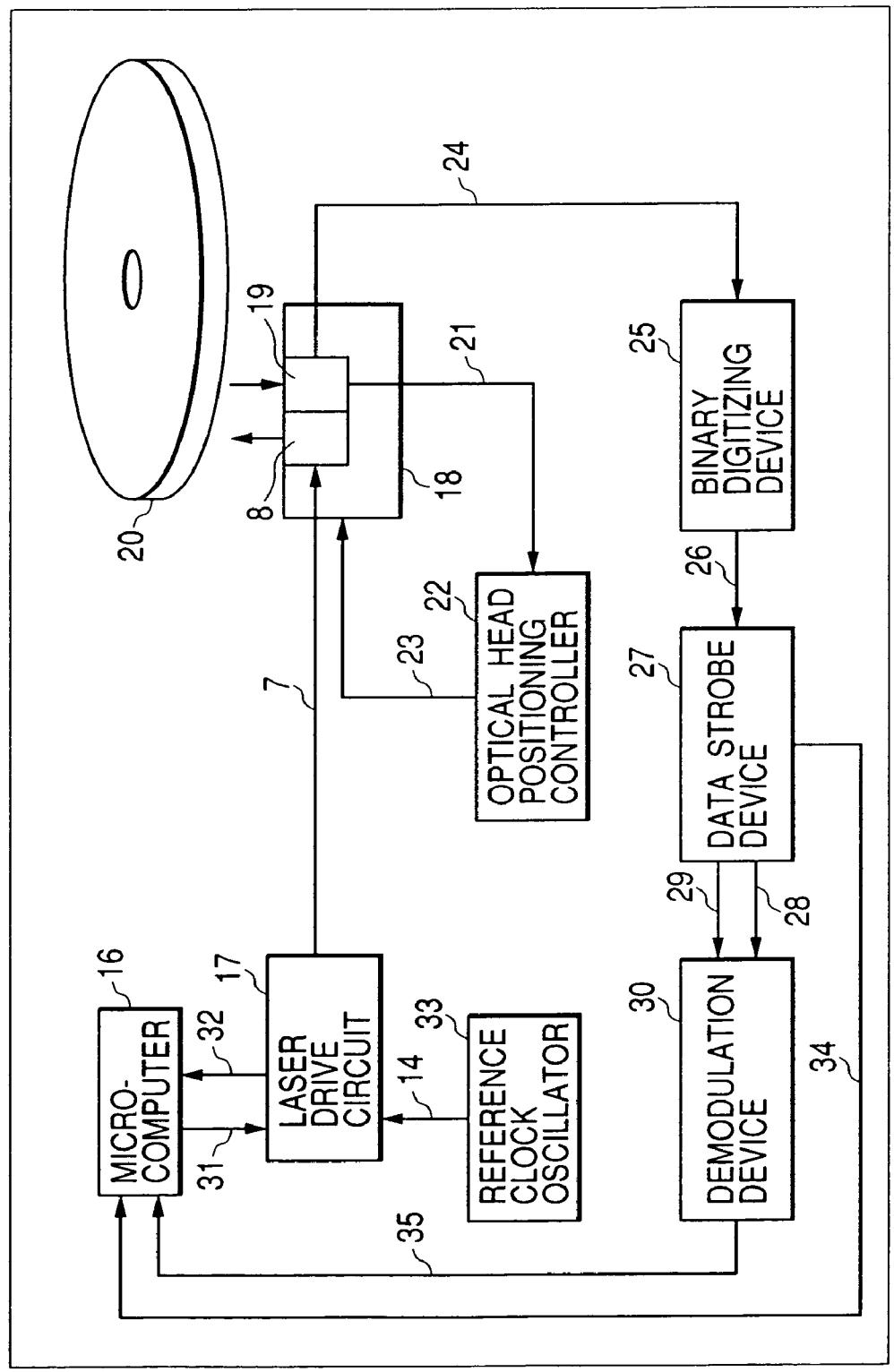
FIG. 5 is a block diagram of the optical disk apparatus based on a third embodiment of this invention.

In FIG. 5, a laser driver 17 is derived from the counterpart shown in FIG. 1, and it is made up of an oscillator 4 which generates a high-frequency current, a frequency counter which measures the frequency of the high-frequency current from the oscillator 4 based on a reference clock signal 14, and a register 15 which holds the measured frequency value. The laser driver 17 outputs a semiconductor laser diode current 7, which energizes a laser diode 8 fitted on an optical head 18 to emit a laser beam.

The optical head 18 projects the laser beam of the laser diode 8 onto the optical disk 20 and detects the reflected light from the optical disk with a photo detector 19. The photo detector 19 functions to convert the sensed light intensity into an electrical signal, thereby outputting a servo error signal 21 and a reproduced signal 24 which is derived from information recorded on the optical disk 20. The optical disk 20 has an encoded record of user data and also error correction data, by which errors included in the reproduced user data is corrected by a demodulation device 30 which will be explained later.

An optical head positioning controller 22 processes the servo error signal provided by the photo detector 19 and outputs a resulting servo signal 23 into the optical head 18. Based on the servo signal 23, the optical disk 20 and optical head 18 have a normal positional relation to get a stable reproduced signal 24.

A binary digitizing circuit 25 digitizes the reproduced analog signal 24 from the photo detector 19 into a binary reproduced signal 26.

A data strobe device 27 converts the digital reproduced signal provided by the digitizing circuit 25 into a synchronous reproduced signal 29 which is synchronized with a channel clock signal 28, and outputs the signal 29 into the demodulation device 30.

Figure 6:
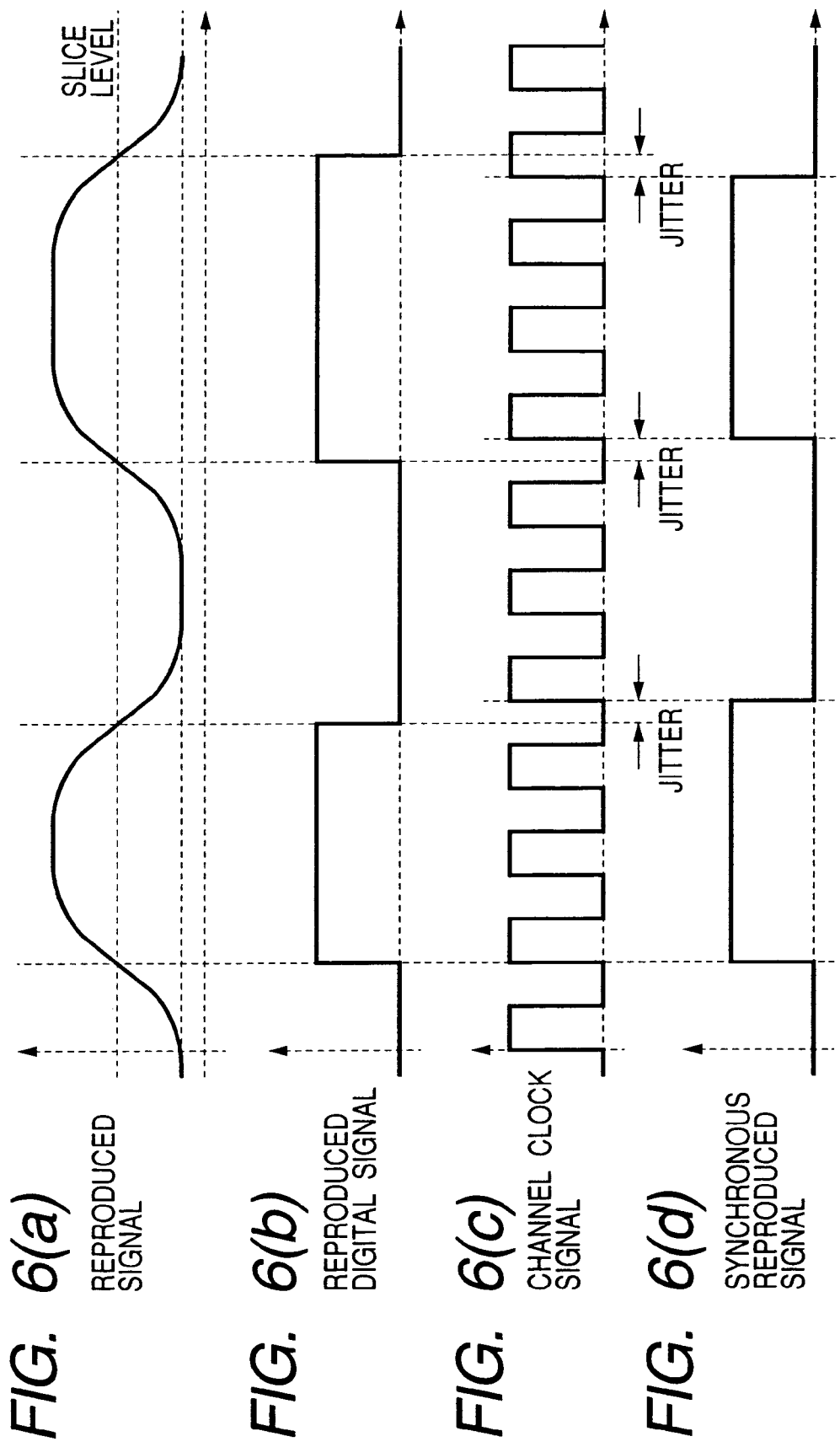
FIG. 6 is a waveform diagram showing the signals in the optical disk apparatus of the third embodiment.
Figure 7:
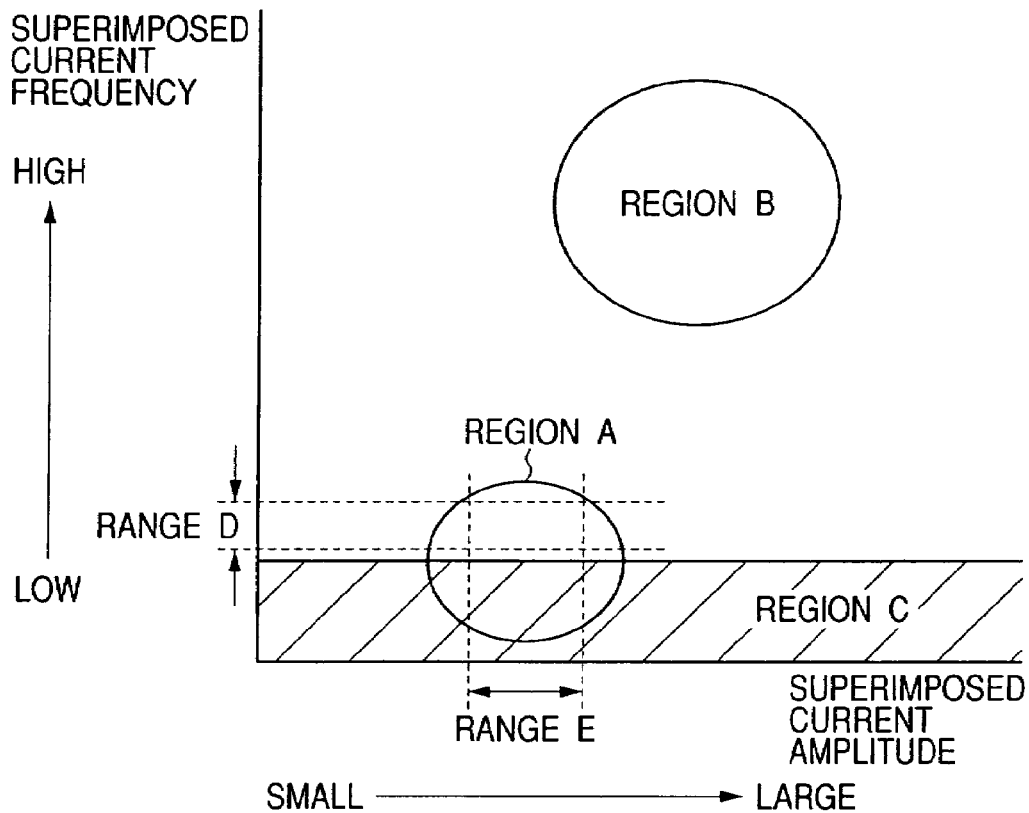
FIG. 7 is a graph used to explain the optimal condition of high frequency superimposition.

FIG. 6 shows the waveforms of the reproduced signal 24, digital reproduced signal 26 and synchronous reproduced signal 29. The digital reproduced signal 26 is out of phase with the channel clock signal 28 as shown. The data strobe device 27 is based on the PLL operation to synchronize the reproduced signal 26 with the channel clock signal 28, thereby producing the synchronous reproduced signal 29. The data strobe device 27 also functions to detect the jitter, which is the deviation of the digital reproduced signal 26 from the channel clock signal 28, and store the evaluated jitter.

The demodulation device 30 decodes the synchronous reproduced signal 29 provided by the data strobe device 27. Since information recorded by being encoded on the optical disk includes error correction data as mentioned previously, it is necessary to decode the synchronous reproduced signal 29 to extract user data. If user data includes errors, the demodulation device 30 restores correct user data based on the error correction data and also counts the number of errors (error rate).

In consequence, the quality of reproduced signal released by the optical disk apparatus is indicated quantitatively in terms of the error rate and jitter evaluated by the demodulation device 30 and data strobe device 27, respectively. This optical disk apparatus is capable of controlling the superimposed frequency of the semiconductor laser drive current 7 in response to the oscillator control signal 31 which is provided by a microcomputer 16 for the oscillator of laser driver. The variation of superimposed frequency affects the quality of reproduced signal, and the variation of quality of the reproduced signal can be evaluated qualitatively in terms of the values of jitter and error detected by the digitizing circuit 25 and demodulation device 30 and indicated as a jitter value 34 and error rate 35 to the microcomputer 16. The microcomputer 16 determines the superimposed frequency for the optimal data reproduction based on the jitter value 34, error rate 35, and the frequency of superimposed current measured by the laser driver 17. The determined frequency value carried by the oscillator control signal 31 is used to control the oscillator of laser driver thereby to optimize the superimposed frequency. Based on this arrangement, even if the frequency condition for the achievement of minimal laser noise varies due to the temperature variation or the like, it becomes possible to control the frequency of superimposed current more accurately based on its measurement within the laser driver.

Although it can be possible to determine the optimal superimposed frequency for minimizing the jitter and error of the reproduced signal by varying the oscillator power voltage without knowing the actual frequency, the frequency can not be identified without the measurement of the frequency of superimposed current and even the frequency deviation out of the valid range can not be recognized.

The optical disk apparatus of this embodiment is characterized by determining the optimal frequency of the superimposed current based on its measurement, enabling the full use of the valid frequency range when the regulation is imposed. Moreover, the apparatus is capable of adjusting the superimposed frequency of semiconductor laser simply and accurately within it, instead of using an external facility.

Figure 8:
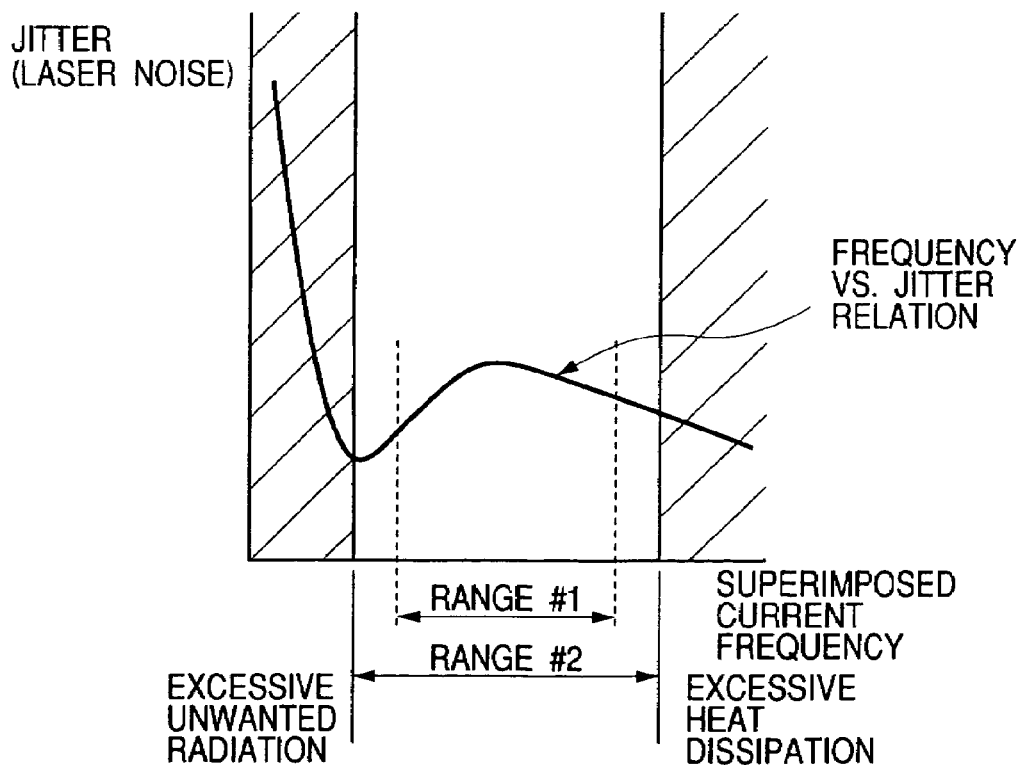
FIG. 8 is a graph used to explain the relation between the superimposed frequency and the jitter, and also the allowable frequency setting range for high frequency superimposition.

FIG. 8 shows the relation between the superimposed frequency and the jitter resulting from the measurement of jitter, with the superimposed frequency being varied continuously. On the graph, the low-frequency region is avoided due to the regulation of unwanted radiation and the high-frequency region is avoided due to a large heat dissipation. In contrast to a laser driver without a frequency measuring function, in which case it is necessary to consider the disparity of oscillation frequency among individual laser drivers and it is merely possible to set a superimposed frequency at the minimal jitter within range #1 of FIG. 8 instead of the full use of the valid range, the inventive laser driver having the frequency measuring function can set a superimposed frequency at the minimal jitter within the full valid range #2 which is wider than the range #1.

According to the optical disk apparatus and the laser driver used for it based on the foregoing embodiments, the adjustment of laser driver which is needed for the low-noise driving of semiconductor laser can be performed simply and accurately.

The invention claimed is:

1. An optical disk apparatus comprising:
   a semiconductor laser which emits a laser beam onto an optical disk;
   a semiconductor laser driver which produces a high frequency current and drives said semiconductor laser with a current, with the high-frequency current being superimposed thereon, and measures the frequency of said high-frequency current,
   wherein said laser driver includes:
      a semiconductor laser drive circuit which feeds a DC current to said semiconductor laser;
      a high frequency superimposing oscillator which produces a high-frequency current to be superimposed on the output current of said semiconductor laser drive circuit; and
      a frequency measuring circuit which measures the frequency of the high-frequency current produced by said high frequency superimposing oscillator and outputs the measured frequency to said main controller,
   wherein said frequency measuring circuit includes:
      a binary digitizing circuit which converts the high-frequency current into a digital signal;
      a frequency demultiplying circuit which implements the frequency demultiplication for the digital signal to produce the high frequency superimposition monitor signal; and
      a frequency counter which counts the frequency of the high-frequency of the high-frequency current based on a reference clock signal supplied from the outside of said laser driver and the high frequency superimposition monitor signal;
   a main controller which controls the frequency of said high-frequency current produced by said semiconductor laser driver by using the frequency measured by said semiconductor laser driver, wherein said main controller controls the frequency of said high-frequency current within valid frequency range of a regulation; and
   a register which holds the value of frequency measured by said frequency measuring circuit.

2. The optical disk apparatus according to claim 1 further including:
   a demodulation device which implements the error correction for reproduced data and evaluates the error rate, said main controller determining the superimposed frequency at which the error rate is minimal by using the frequency measured by said frequency measuring circuit and the error rate evaluated by said demodulation device and controlling said high frequency superimposing oscillator to produce a high-frequency current of the determined frequency.

3. The optical disk apparatus according to claim 2 further including:

a data strobe device which detects the jitter emerging at the conversion of a reproduced signal into a digital signal, said main controller determining the superimposed frequency at which the jitter is minimal by using the frequency measured by said frequency measuring circuit and the jitter evaluated by said data strobe device and controlling said high frequency superimposing oscillator to produce a high-frequency current of the determined frequency.

* * * * *